United States Patent
Leong et al.

(10) Patent No.: US 9,680,495 B1
(45) Date of Patent: Jun. 13, 2017

(54) DATA CONVERSION

(71) Applicant: NXP B.V., Eindhoven (NL)

(72) Inventors: Frank Leong, Veldhoven (NL); Erwin Janssen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/439,182

(22) Filed: Feb. 22, 2017

(30) Foreign Application Priority Data

Mar. 7, 2016 (EP) ..................... 16158953

(51) Int. Cl.
*H03M 1/66* (2006.01)
(52) U.S. Cl.
CPC ..................... *H03M 1/66* (2013.01)
(58) Field of Classification Search
CPC ........ H03M 1/66; H03L 7/0891; H04L 7/033; H04L 27/2647
USPC ........................................ 341/144
See application file for complete search history.

(56) References Cited

U.S. PATENT DOCUMENTS

| | | | |
|---|---|---|---|
| 6,393,071 B1 | 5/2002 | Bourzeix | |
| 6,693,987 B1 * | 2/2004 | Hattori | H03L 7/0805 327/156 |
| 7,352,255 B1 | 4/2008 | Green | |
| 7,532,697 B1 | 5/2009 | Sidiropoulos et al. | |
| 8,195,972 B2 * | 6/2012 | Renner et al. | G06F 1/08 327/149 |
| 2007/0222527 A1 | 9/2007 | Pretl | |
| 2014/0091842 A1 | 4/2014 | Mehio et al. | |

FOREIGN PATENT DOCUMENTS

WO 2009/096413 A1 8/2009

OTHER PUBLICATIONS

Vaucher, C.S. et al. "A Family of Low-Power Truly Modular Programmable Dividers in Standard 0.35-μm CMOS Technology", IEEE Journal of Solid-State Circuits, vol. 35, No. 7, pp. 1039-1045 (Jul. 2000).
Siau, J. et al. "Jitter and its Effects", pp. 1-5, retrieved from the Internet Feb. 21, 2017 at: http://benchmarkmedia.com/blogs/white-papers/12142221-jitter-and-its-effects.
Najari, O.E. "Project:WISPA Its Crystal Oscillator Design Report", Catena, 39 pgs. (Nov. 14, 2013).
Cardoso, R. et al. "Kalman Filter Based Synchronization Methods", 37th IEEE Power Electronics Specialists Conference, pp. 1-7 (Jun. 2006).
Wikipedia "Voltage-controlled oscillator", pp. 1-5 (2015).

\* cited by examiner

*Primary Examiner* — Khai M Nguyen
(74) *Attorney, Agent, or Firm* — Rajeev Madnawat

(57) ABSTRACT

A data conversion system and method are described. A first phase locked loop includes a controllable frequency oscillator circuit to receive a digital data stream and output a reference frequency signal, and includes an oscillator and at least one variable load connected to the oscillator which is controllable to tune the oscillator frequency and vary the frequency of the reference frequency signal. A second phase locked loop includes a divide by N function in a feedback loop (where N has an integer value), and receives the reference frequency signal and outputs a recovered clock signal corresponding to an original clock signal associated with the digital data stream. The recovered clock signal is used to clock a data converter to convert the digital data into an analog output signal.

15 Claims, 3 Drawing Sheets

DATA CONVERSION

CROSS-REFERENCE TO RELATED APPLICATIONS

This application claims the priority under 35 U.S.C. §119 of European Patent application no. 16158953.6, filed on Mar. 7, 2016, the contents of which are incorporated by reference herein.

The present specification relates to electronic data conversion and in particular to electronic circuits, systems or devices, and methods of operation, for converting digital data into analog data using a recovered clock signal associated with digital data.

There are a number of areas in which data is generated or obtained and some reference signal is associated with the data as it is generated or obtained. For example a reference signal may be used to provide synchronous operation between different parts of a data processing device or a reference signal may be used to read, write or otherwise process the data. In instances where the source of data and sink of data are local to each other, then the reference signal may also be supplied with the data to the sink of data so that the sink of data can use the reference signal.

However, in instances where the source of data and sink or data are not local then it may not be practicable to transmit both the data and the reference signal to the sink of data. There may also be instances where even though the source and sink of data are local, it is not practicable to provide the reference signal to the sink of data. In such instances when the reference signal is not available to the sink, for whatever reason, some form of reference signal recovery process may be used. Generally speaking, either the data and/or an approximation of the original reference signal are processed to try and regenerate or recover the original reference signal so that the recovered reference signal can be used by the sink of data to process the data.

Ideally, the recovered reference signal should be as close as possible to the original reference signal. However, for higher speed data, the degree of similarity required between the recovered reference signal and original reference signal may be quite high, for example at the parts per million accuracy level, in order to try and ensure reliable processing of the data by the sink.

Hence, electronic circuits and devices and methods of operation that provide good reference signal recovery for use in data conversion may be beneficial.

According to a first aspect of the present disclosure, there is provided a system for converting digital data to analog data, the system comprising: a clock signal recovery circuit for recovering an original clock signal associated with a digital data stream, the clock signal recovery circuit comprising: a first phase locked loop including a controllable frequency oscillator circuit and having an input arranged to receive a digital data stream and an output arranged to output a reference frequency signal, wherein the controllable frequency oscillator circuit includes an oscillator operable at an oscillator frequency and at least one variable load connected to the oscillator and wherein the variable load is controllable to tune the oscillator frequency and vary the frequency of the reference frequency signal; and a second phase locked loop including a divide by N function in a feedback loop, wherein N has an integer value, and having an input arranged to receive the reference frequency signal and an output arranged to output a recovered clock signal corresponding to an original clock signal associated with the digital data stream; and a data converter arranged to receive the digital data stream and the recovered clock signal and to be clocked by the recovered clock signal to convert the digital data stream into an analog output signal.

Varying the frequency of an oscillator used in first phase locked loop and using its output as the reference frequency for a second phase locked loop, with integer N division feedback, may improve the spectral purity and/or noise of a clock signal being recovered for use in converting the data into analog data.

In one or more embodiments, the data converter may be a digital to analog converter.

In one or more embodiments, the variable load may be a variable impedance. The variable impedance may be a variable capacitance or a variable inductance.

In one or more embodiments, the variable capacitance may comprise a first digitally controllable capacitance connected to a first terminal of the oscillator and/or a second digitally controllable capacitance connected to a second terminal of the oscillator.

In one or more embodiments, the first phase locked loop may include a loop filter and the controllable load may be arranged to be controlled by an output signal of the loop filter.

In one or more embodiments, the first phase locked loop may be an all-digital phase locked loop (ADPLL).

In one or more embodiments, the first phase locked loop may include a loop filter, and wherein the loop filter is configured to have its loop filter parameters updated via Kalman filtering.

In one or more embodiments, the recovered reference signal may have a frequency in the range of 1 kHz to 500 MHz, or in the range of range of 20 kHz to 200 MHz, or in the range of 1 MHz to 100 MHz, or in the range of 1 MHz to 50 MHz.

In one or more embodiments, the digital data stream may be a digital audio data stream.

In one or more embodiments, the reference frequency signal may have a frequency greater than the frequency of the original clock signal and the system may further comprise a frequency reduction element arranged to receive an initial recovered clock signal from the second phase locked loop and to reduce the frequency of the initial recovered clock signal and output the recovered clock signal. The frequency reduction element may be a 'divide by N' element.

In one or more embodiments, the system may further comprise a data recovery circuit having a first input for receiving the digital data stream and a second input for receiving the recovered clock signal and configured to generate recovered digital data from the digital data stream and arranged to supply the recovered digital data to a further input of the digital to analog converter.

In one or more embodiments, the data recovery circuit may be further configured to parallelise the recovered digital data and output the recovered digital data in parallel.

According to a second aspect of the present disclosure, there is provided a package comprising a semi-conductor integrated circuit, wherein the semi-conductor integrated circuit is configured to provide the system of the first aspect.

According to a third aspect of the present disclosure, there is provided an electronic device or apparatus including the system of the first aspect or the package of the second aspect. In one or more embodiments, the electronic device or apparatus may be a consumer product. In one or more embodiments, the electronic device or apparatus may be an audio product.

According to a fourth aspect of the present disclosure, there is provided a method for converting digital data to an analog signal, comprising: controlling a variable load connected to an oscillator to tune an oscillator frequency and vary the frequency of a reference frequency signal output by a first phase locked loop which includes the oscillator and which receives a digital data stream at an input; operating a second phase locked loop including a divide by N function in a feedback loop, wherein N has an integer value, and which receives the reference frequency signal as an input, to output a recovered clock signal corresponding to an original clock signal associated with the digital data stream; and using the recovered clock signal to clock a data converter to convert the digital data of the digital data stream into an analog output signal.

Features of the first and second aspects may also be counterpart features for the fourth aspect.

An embodiments of the invention will now be described in detail, by way of example only, and with reference to the accompanying drawings, in which.

Similar items in the different Figures share like reference signs unless indicated otherwise.

Figure 1:
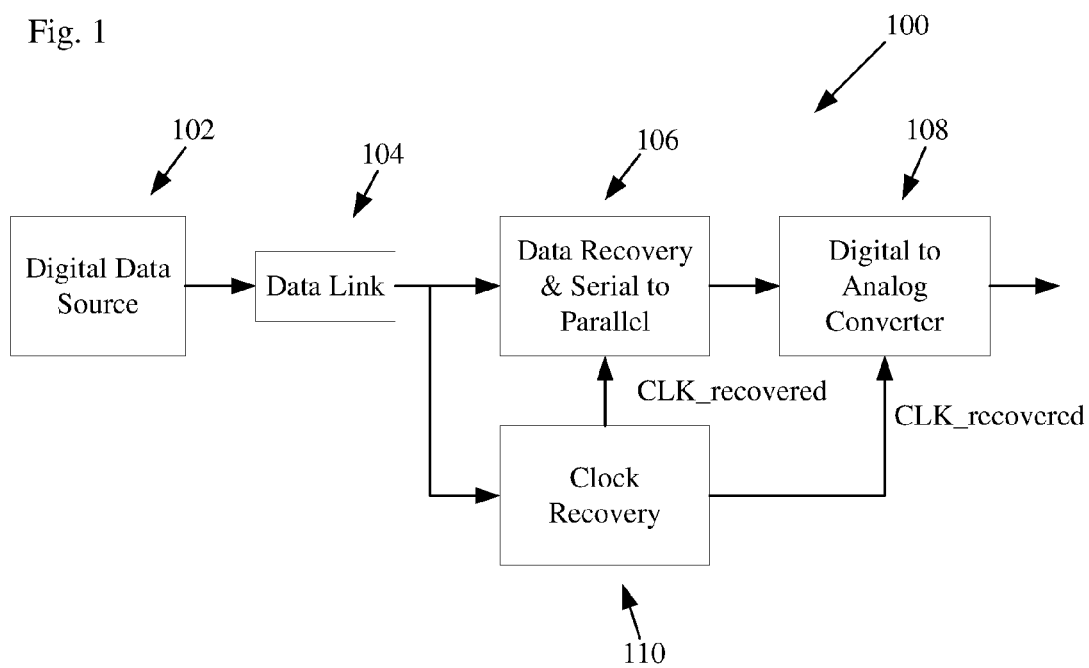
FIG. 1 shows a schematic block diagram of an example system in which a clock signal recovery circuit and data converter may be used.

With reference to FIG. 1, there is shown a schematic block diagram of an electrical system 100 in which a recovered clock signal is used to control a digital to analog converter (DAC). Although operation of the system 100, and parts of the system 100, will be described within the context of clock signal recovery, the parts of the system are not necessarily limited to that application and may be used to recover any type of oscillating reference signal for which a good degree of spectral purity and/or low noise may be beneficial.

System 100 will be described within the context of recovering a clock signal associated with a stream of serial digital data in order to clock a DAC to convert the digital data into analog data.

The system 100 includes a source of digital data 102 which may be of various types. Generally the digital data will be in the form of a serial stream of digital data and will have a clock signal associated with it which identifies the data boundaries. The exact nature of the data boundary may vary between different data formats and standards. A common association is with data symbol boundaries, which can represent one or multiple bits depending on the data modulation format used. Alternatively, in systems designed for robustness, a data bit may be represented by multiple data symbols or "chips", which are typical in spread-spectrum radio systems. In that case, each data symbol or chip may be referred to as a 'sub-bit'.

For example, the source of digital data 102 may provide video data according to a digital video standard such as HDMI, the source of digital data 102 may provide peripheral and/or video data according to a bus standard such as USB, or the source of digital data may provide audio data according to a digital audio standard, such as S/PDIF, AES3, HDMI, AC'97, Intel HDA, ADAT, I2S, FireWire, or synchronous USB audio. Irrespective of the specific standard and content of the digital data, the digital data is generally generated at the source in association with a clock signal at a reasonably high clock frequency of, for example, several MHz, tens of MHz or hundreds of MHz The digital data is then transmitted from the digital data source to a sink of the digital data over one or more communication channels of some data link 104. The data link 104 may be a local data link, such as a bus within a single system, or over a cable or similar between separate parts of the system or over a local or wide area network. Irrespective of the nature of the data link 104, typically only the digital data is transmitted to the sink and not also the clock signal of the digital data source 102. However, even in other embodiments in which the clock signal is also transmitted directly, the clock signal may suffer from significant phase noise or jitter and hence the system may still benefit from local clock signal recovery at the sink of digital data.

The sink part of the system 100 may include a data recovery part 106 which receives and processes the serial stream of digital data in order to recover the data from the incoming data stream, for example by identifying transitions between different signal level states. The data recovery part 106 may also optionally include a serial to parallel conversion functionality for applications where the sink uses data in a parallel format rather than a serial format. The structure and operation of a suitable data recovery device, with optional serial to parallel conversion, is generally known by a person of ordinary skill in this art and so is not described in further detail below.

The output of the data recovery part 106 is supplied to a digital to analog converter (DAC) 108 which converts the input digital data into an analog output signal. The analog output signal may then be supplied to other circuitry to drive whatever end device is appropriate, e.g., an analog display device, an audio amplifier, and audio speaker or similar. Again, the structure and operation of a suitable DAC 108 is generally known by a person of ordinary skill in this art and so is not described in further detail below.

The system 100 also includes a clock recovery device or circuit 110 which operates to recover the clock signal originally used by the digital data source 102 and supply the recovered clock signal, CLK_recovered, which has been generated locally at the sink of data, to both the data recovery part 106 and the DAC 108. As illustrated in FIG. 1, the clock recovery circuit 110 also receives the serial data stream as an input. The clock recovery circuit then processes the incoming serial data stream, as described in greater detail below, in order to generate the recovered clock signal, CLK_recovered, which it supplies to the data recovery part 106 and also the DAC 108 in order to recover the digital data and then convert the recovered digital data into analog data. Ideally, the clock signal used by the DAC should have a good spectral purity, but this can be difficult to achieve in combination with the requirement that the recovered clock signal, CLK_recovered, should track the external clock signal used at the digital data source 102. The clock recovery circuit 110, described in greater detail below, is configured to provide a recovered clock signal with good spectral purity and low noise.

Figure 2:
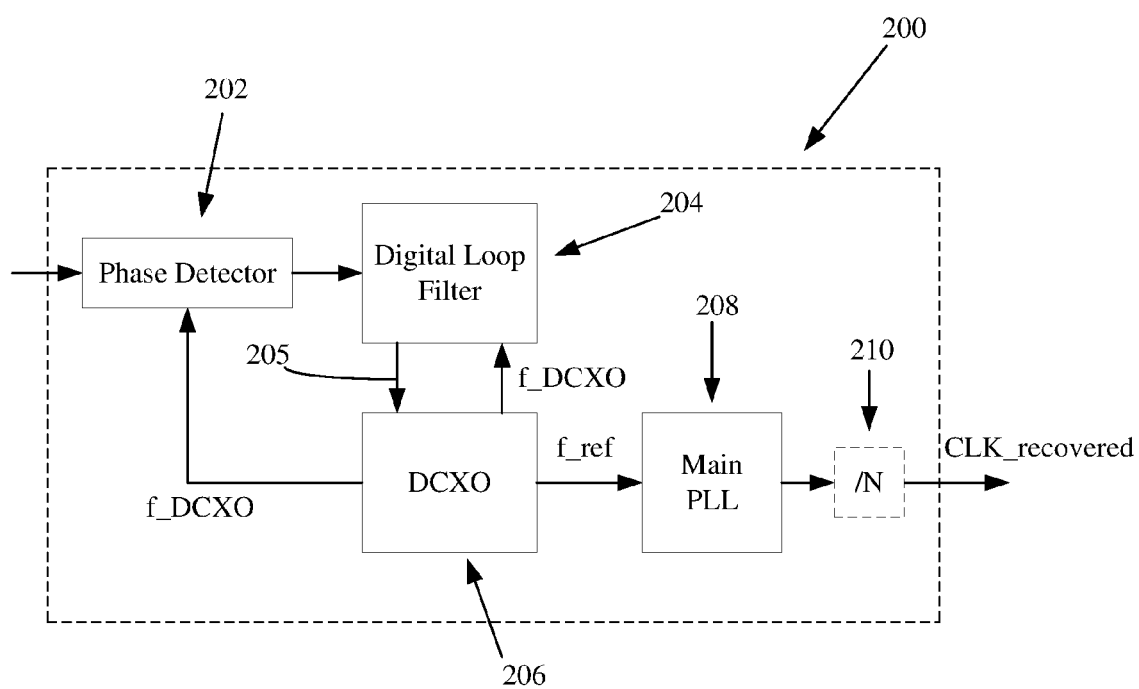
FIG. 2 shows a schematic block diagram of an example reference signal recovery circuit of the system of FIG. 1.

FIG. 2 shows a schematic block diagram 200 of a clock recovery circuit corresponding generally to clock recovery circuit 110 of the system 100 of FIG. 1. Clock recovery circuit 200 includes a phase detector part 202 which receives at its input the serial digital data stream. In one embodiment, the phase detector party 202 may be implemented as a bang-bang phase detector, the structure and operation of which is generally known to a person of ordinary skill in the art. An output of the phase detector part 202 is connected to the input of a digital filter 204. Digital filter 204 is generally configured as a low pass filter. An output of the digital filter 204 is provided to an input of a digitally controlled crystal oscillator (DCXO) circuit 206, which is described in greater detail below with reference to FIG. 3.

The output 205 of the digital filter 204 is used to control the frequency of a crystal oscillator of the DCXO circuit which outputs a digitally controllable frequency signal f_DCXO to an input of the phase detector 202 and also to an input of the digital filter 204. The digital loop filter 204 may be a clocked system, typically clocked at the frequency f_DCXO, which signal is received from the DCXO 206. The digitally controllable frequency signal f_DCXO is used by the phase detector 202 in processing the incoming digital data stream to generate a signal indicative of the phase difference between the frequency of the incoming digital data stream and the current value of f_DCXO. The signal indicative of the phase difference is then filtered by digital filter 204 to output the control signal which is used to modify the frequency of the crystal oscillator of DCXO circuit 206.

Hence, the phase detector 202, digital loop filter 204 and DCXO 206 provide an all-digital phase locked loop (AD-PLL) in which the frequency of the crystal oscillator can be modulated to provide an output signal, f_ref, which is then supplied as an input reference frequency to a main phase locked loop 208 which is used to generate the recovered clock signal CLK_recovered.

The clock signal recovery circuit may optionally include a 'divide by N' element 210 attached to the output of the main phase locked loop 208. The frequency, f_ref, output from the DCXO might be either higher or lower than the frequency of the clock signal to be recovered, depending on the frequency of the crystal oscillator. When f_ref is lower than CLK_recovered, then the second PLL can be used to multiply the reference frequency, as described in greater detail below. However, when f_ref is greater than CLK_recovered, then the reference frequency needs to be reduced. In that instance, the divide by N circuit, where N is a positive integer, may be provided and used to divide the signal output by the main phase locked loop 208 to arrive at the desired frequency for the recovered clock signal CLK_recovered.

The main phase locked loop 208 is described in greater detail below with reference to FIG. 4. The recovered clock signal, CLK_recovered, can then be supplied from the output of the clock recovery circuit 110 to the data recovery circuit 106 and to the DAC 108 as illustrated in FIG. 1.

Figure 3:
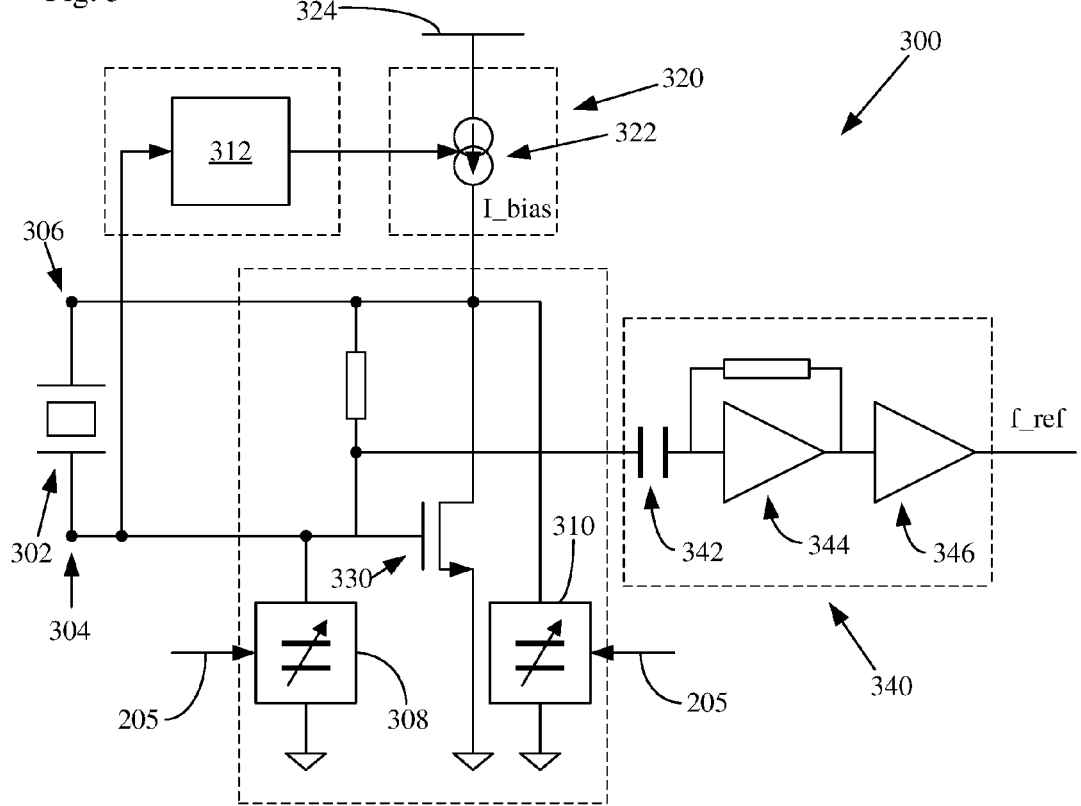
FIG. 3 shows a schematic block diagram of a digitally controlled crystal oscillator circuit of the reference signal recovery circuit shown in FIG. 2.

FIG. 3 shows a schematic circuit diagram 300 of the digitally controllable crystal oscillator part 206 of the clock recovery circuit 110. The digitally controllable crystal oscillator circuit 300 includes a crystal oscillator 302 having a first terminal 304 and a second terminal 306. A first variable capacitance 308 is connected to the first terminal 304 and a second variable capacitance 310 is connected to the second terminal 306. In one embodiment, the first variable capacitance 308 and the second variable capacitance 310 are each implemented as digitally switched capacitor arrays. The first 306 and second 310 variable capacitances receive various control signals 205 output from the loop filter 204 to vary their capacitances. The variable capacitances 306, 310 may also be clocked systems and may also receive f_DCXO as a clocking signal. Variable capacitances 306, 310 may in practice be banks of digital capacitors which are connected to the programming line 205 form the digital loop filter 204.

The first terminal 304 of the crystal oscillator 302 is connected to an amplitude regulator circuit 312. An output signal from the amplitude regulator circuit 312 is connected to a biasing circuit 320 which includes a variable current source 322 connected to a local power rail 324 and arranged to provide a bias current I_bias which is adjustable based on the output of the amplitude regulator circuit. The bias current I_bias is supplied to the source of a transistor 330 whose gate is connected to the first terminal of the crystal oscillator in parallel with the first variable capacitance 308. The amplitude regulator circuit 312 and biasing circuit 320 are configured to control the amplitude of oscillation of the crystal oscillator 302 by controlling the effective amount of negative resistance of the active core of the oscillator circuit 300.

A sample of the voltage across the crystal oscillator 302 is connected to a buffer circuit 340. The buffer circuit includes an input capacitor 342 which provides DC blocking and which is connected to a first digital inverter 344 in series with a second digital inverter 346. The buffer circuit 340 is configured to prevent the generation of harmonic currents. The signal output by the buffer circuit 340 is used as both the feedback control signal f_DCXO and is also supplied to the main phase locked loop circuit 208 as the reference frequency signal, f_ref, commonly having a generally square wave form. In other embodiments, f_ref, may have a sine wave form.

Figure 4:
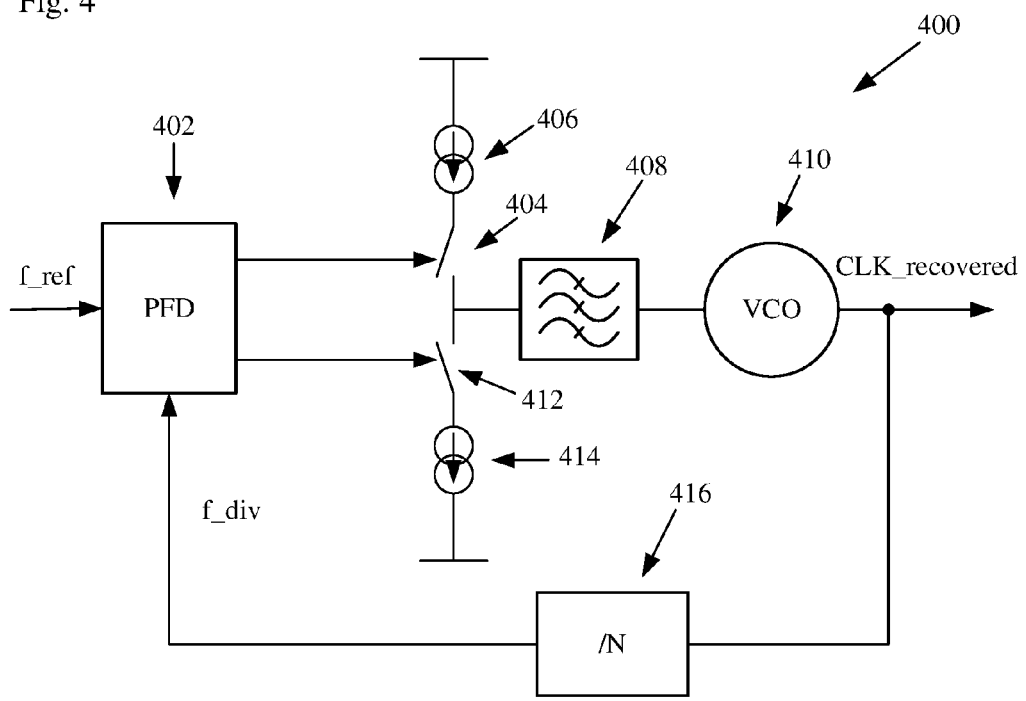
FIG. 4 shows a schematic block diagram of a main phase locked loop circuit of the reference signal recovery circuit shown in FIG. 2.

FIG. 4 shows a schematic block diagram 400 of the main phase locked loop (PLL) part 208 of the clock recovery circuit 110. As noted above, the main PLL receives the output of the DCXO circuit 206 as its input reference frequency signal, f_ref, which the main PLL 208 is configured to lock to. The reference frequency signal, f_ref, is supplied to a first input of a phase frequency detector (PFD) 402. A fed back reduced frequency signal, f_div, is supplied to a second input of the phase frequency detector 402. The phase frequency detector is configured to compare the two input signals and produce an output signal which is proportional to their phase difference. If the phase difference is positive, then a first output signal is generated to control a first switch 404 to connect a first current source 406 to a low pass filter 408 whose output is used to control a voltage controlled oscillator (VCO) 410 to change its frequency of oscillation. If the phase difference is negative, then a second output signal is generated to control a second switch 412 to connect a second current source 414 to the low pass filter 408 whose output is used to control the voltage controlled oscillator (VCO) 410 to change control its frequency of oscillation in the opposite sense.

The output signal of the voltage controlled oscillator 410 is fed back via a frequency divider, or a 'divide by N', circuit element 416, which has a frequency division ratio, M, having a positive integer value. Hence, the frequency of the fed back signal, f_div, is equal to, or lower than, the frequency of the incoming reference signal, f_ref, owing to some integer divisor, e.g., M=1, 2, 3, 4, etc. Hence, the PLL 400 operates generally like a conventional phase locked loop using negative feedback to control the VCO to adjust the frequency of its output signal until it settles on a signal having a constant substantially zero phase difference to the reference signal, f_ref, and hence locking to the multiple of M times that frequency, i.e. M×f_ref. As noted above, and illustrated in FIG. 2, in instances in which f_ref is greater than CLK_recovered, then a further divide by N circuit 210, with a frequency division ratio, N, and with N being an integer value greater than 1, can be attached to the output of the VCO 410 to reduce the initial value of CLK_recovered down to the target value for CLK_recovered, and being equal to M/N times f_ref.

The recovered clock signal CLK_recovered is then output by the clock recover circuit 110 and used by the data recovery circuit and by the DAC 108.

For many applications, including audio, spectral purity of the clocking in the digital-to analog conversion (DAC) is important. However, the requirement of following an external source clock makes this a difficult requirement to implement. The above described crystal oscillator tuning method may improve the spectral purity of the digital to-analog converter's clocking system.

In practice, there will usually be a finite difference in the frequency of the clock signal of the source of data and the recovered clock signal at the sink of data of a clock and data recovery system. Since the source of data determines the rate at which data becomes available, the sink of data follows the source of data in order to not overflow or underflow any data buffer. Using a local voltage controlled oscillator can help to lower any jitter in the recovered data. Any approach that uses a frequency divider with a value of modulus M, where M is a fraction, in the main phase locked loop 400 would introduce spurious tones into the recovered clock signal, CLK_recovered. This may be particularly noticeable in audio applications, where spurious tones are particularly undesirable, as the human ear can typically distinguish them as far down as −25 dB compared to the thermal noise floor.

This approach uses integer-N division in operation of the PLL 400 with respect to the reference frequency f_ref received from the DCXO. Integer-N division operation is achieved by modulating the reference frequency itself, rather than changing the value of N in the feedback loop of the PLL. This modulation of f_ref is achieved by modulating the load capacitances 308, 310 at the crystal terminals, which allows for a tuning range in the range of several tens of ppm, to match the recovered clock signal with the original clock signal of the data source. In this way, if the data source is compliant with a standard, for example HDMI, DAB, or USB, then the proposed tuning method typically provides sufficient range.

Various ways of implementing a tracking loop for the controllable crystal oscillator 302 are possible. The approach described above with reference to FIG. 3 implements the loop as a narrow-band ADPLL, using switchable capacitors 308, 310 at the crystal terminals 304, 306. This allows the use of a standard crystal, eliminates the use of external capacitors, thereby reducing PCB footprint and materials cost, and eliminates any fractional-N spurious components to the recovered clock signal. Overall, the result is a spurious-free and low-noise clock signal recovery function that provides a very clean clock signal to be used in a digital-to-analog converter (DAC).

Furthermore, the ADPLL can be implemented as a Kalman filter, allowing it to adjust loop filter parameters in order to both settle quickly after data link activation and offer good resilience against application-related interference and noise. Kalman filtering is generally known in the art and its application to control loops is described, for example, in "Kalman Filter Based Synchronization Methods", R. Cardoso et al., Proc. IEEE Power Electronics Specialists Conference June 2006.

Figure 5:
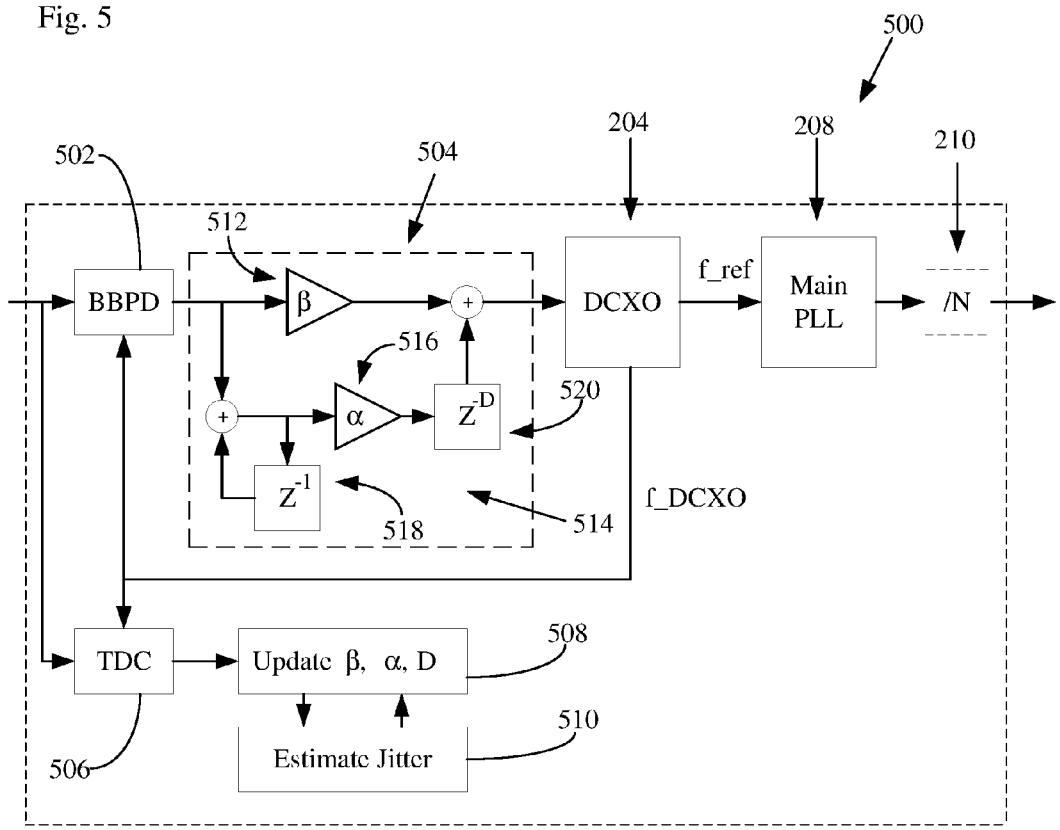
FIG. 5 shows a schematic block diagram of a further example reference signal recovery circuit of the system of FIG. 1.

FIG. 5 shows a further embodiment 500 of the clock recovery circuit 110 similar to that shown in FIG. 2, but in which the loop filter is implemented as a Kalman filter. Similar items share common reference signs and so are not described in detail again. The incoming data stream is supplied to a phase detector 502 in the form of a bang bang phase detector whose output is supplied to a digital loop filter indicated by dashed box 504. The output, f_DCXO, of the digital loop filter 504 is supplied to the digitally controlled crystal oscillator 204 whose output, f_ref, is supplied to the main phase locked loop 208 which directly, or indirectly via optional divide by N circuit 210, outputs the recovered clock signal, CLK_recovered.

The output, f_DCXO, of the DCXO 204 is fed back to the bang bang phase detector 502 and is also supplied to a Time-to-Digital Converter (TDC) 506 which also receives the incoming data stream as a second input. The output of the TDC is supplied to storage and/or logic 508 to update current values of parameters (a, (3, D) used to set the filter characteristic of the loop filter 504. Jitter estimation logic 510 is also provided to estimate a jitter value for the incoming data stream (e.g. by creating a histogram of the phase error over time) and to provide estimated values of one or more of the loop filter parameters. The loop filter 504 includes a proportional path which includes an amplifier 512 which applies a scaling factor $\beta$ to the output of the bang bang phase detector. The loop filter 504 also includes an integrating path 514 which includes a further amplifier 516 which applies a scaling factor $\alpha$ to the output of the phase detector, but integrated by delay element 518 connected in a feedback configuration. The output of the further amplifier 516 is then passed to an adjustable delay element 520 which further delays the integral path before being combined with the proportional path to produce the filter output.

The Kalman filter (or LMS algorithm implementation) assumes that the phase noise or jitter on the incoming data is the large unknown that needs to be estimated in order to optimally set the loop filter coefficients $\beta$, $\alpha$ and D. It builds up an estimate of the noise, which is represented as an internal state in logic 510. Alternatively, the noise of the crystal itself may be the large unknown and which is estimated by the Kalman filter. In FIG. 5, the TDC (Time-to-Digital Converter) 506 is shown as the Kalman filter input. Alternatively, the output of the Bang-Bang Phase Detector (BBPD) 502 can also be used. This may result in less accuracy, but may be simpler to implement.

The above described approach is generally applicable to any system using clock and data recovery in combination with a digital-to-analog converter. For example, applications may include S/PDIF, AES3, HDMI, AC'97, Intel HDA, ADAT, I2S, FireWire, or synchronous USB based digital-to-analog converter modules. Also, integrated radio receivers (with on-board digital-to-analog conversion) for digital standards such as DAB or SiriusXM may use this approach.

In some embodiments, some or all of parts 106, 108 and 110 of the system may be implemented as a semi-conductor integrated circuit or as part of a semi-conductor integrated circuit. The semi-conductor integrated circuit may be provided as a die in a package which also includes a lead frame.

Parts 106, 108 and 110 of the system 100 may be used in various apparatus, products, devices or appliances. For example, they may be used in stand-alone HiFi DAC modules, for example with SPDIF or USB inputs, Class-D amplifiers with digital (e.g., SPDIF) inputs, Ethernet-based DACs, digital radio tuners with integrated audio DACs, or car entertainment systems with audio DACs.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A system for converting digital data to analog data, the system comprising:
 a clock signal recovery circuit for recovering an original clock signal associated with a digital data stream, the clock signal recovery circuit comprising:
  a first phase locked loop including a controllable frequency oscillator circuit and having an input arranged to receive a digital data stream and an output arranged to output a reference frequency signal, wherein the controllable frequency oscillator circuit includes an oscillator operable at an oscillator frequency and at least one variable load connected to the oscillator and wherein the variable load is controllable to tune the oscillator frequency and vary the frequency of the reference frequency signal; and
  a second phase locked loop including a divide by N function in a feedback loop, wherein N has an integer value, and having an input arranged to receive the reference frequency signal and an output arranged to output a recovered clock signal corresponding to an original clock signal associated with the digital data stream; and
 a data converter arranged to receive the digital data stream and the recovered clock signal and to be clocked by the recovered clock signal to convert the digital data stream into an analog output signal.

2. The system as claimed in claim 1, wherein the data converter is a digital to analog converter.

3. The system as claimed in claim 1, wherein the variable load is a variable capacitance.

4. The system as claimed in claim 3, wherein the variable capacitance comprises a first digitally controllable capacitance connected to a first terminal of the oscillator and/or a second digitally controllable capacitance connected to a second terminal of the oscillator.

5. The system as claimed in claim 1, wherein the first phase locked loop includes a loop filter and wherein the controllable load is arranged to be controlled by an output signal of the loop filter.

6. The system as claimed in claim 1, wherein the first phase locked loop is an all-digital phase locked loop.

7. The system as claimed in claim 1, wherein the first phase locked loop includes a loop and wherein the loop filter is configured to have its loop filter parameters updated via Kalman filtering.

8. The system as claimed in claim 1, wherein the recovered clock signal has a frequency in the range of 1 MHz to 50 MHz.

9. The system as claimed in claim 1, wherein the digital data stream is a digital audio data stream.

10. The system as claimed in claim 1, wherein the reference frequency signal has a frequency greater than the frequency of the original clock signal and the system further comprising a frequency reduction element arranged to receive an initial recovered clock signal from the second phase locked loop and to reduce the frequency of the initial recovered clock signal and output the recovered clock signal.

11. A system as claimed in claim 2, and further comprising a data recovery circuit having a first input for receiving the digital data stream and a second input for receiving the recovered clock signal and configured to generate recovered digital data from the digital data stream and arranged to supply the recovered digital data to a further input of the digital to analog converter.

12. A system as claimed in claim 11, wherein the data recovery circuit is further configured to parallelise the recovered digital data and output the recovered digital data in parallel.

13. A package including a semi-conductor integrated circuit, wherein the semi-conductor integrated circuit is configured to provide the system of claim 1.

14. An audio product including the system of claim 1.

15. A method for converting digital data to an analog signal, comprising:
 controlling a variable load connected to an oscillator to tune an oscillator frequency and vary the frequency of a reference frequency signal output by a first phase locked loop which includes the oscillator and which receives a digital data stream at an input;
 operating a second phase locked loop including a divide by N function in a feedback loop, wherein N has an integer value, and which receives the reference frequency signal as an input, to output a recovered clock signal corresponding to an original clock signal associated with the digital data stream; and
 using the recovered clock signal to clock a data converter to convert digital data of the digital data stream into an analog output signal.

* * * * *